(12) United States Patent
Lin et al.

(10) Patent No.: US 8,854,515 B2
(45) Date of Patent: Oct. 7, 2014

(54) EFFICIENT SPECTRAL IMAGING BASED ON IMAGING SYSTEMS WITH SCENE ADAPTATION USING TUNABLE COLOR PIXELS

(75) Inventors: Andy Lai Lin, Parsippany, NJ (US); Francisco Imai, Mountain View, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

(21) Appl. No.: 13/584,660

(22) Filed: Aug. 13, 2012

(65) Prior Publication Data

US 2013/0063624 A1    Mar. 14, 2013

Related U.S. Application Data

(60) Provisional application No. 61/532,969, filed on Sep. 9, 2011.

(51) Int. Cl.
| | |
|---|---|
| H04N 3/14 | (2006.01) |
| G03B 7/00 | (2014.01) |
| H04N 5/235 | (2006.01) |
| H04N 5/238 | (2006.01) |
| H01L 27/146 | (2006.01) |
| H04N 9/04 | (2006.01) |
| G01J 3/32 | (2006.01) |
| G01J 3/28 | (2006.01) |

(52) U.S. Cl.
CPC .......... *H04N 9/045* (2013.01); *H01L 27/14645* (2013.01); *G01J 3/32* (2013.01); *G01J 3/2803* (2013.01)
USPC ............................ 348/294; 348/362; 348/364

(58) Field of Classification Search
None
See application file for complete search history.

(56) References Cited

U.S. PATENT DOCUMENTS

| | | | | |
|---|---|---|---|---|
| 2002/0012064 | A1* | 1/2002 | Yamaguchi | 348/362 |
| 2002/0150299 | A1* | 10/2002 | Miller | 382/211 |
| 2003/0030801 | A1* | 2/2003 | Levenson et al. | 356/326 |
| 2003/0098918 | A1* | 5/2003 | Miller | 348/273 |
| 2005/0211873 | A1* | 9/2005 | Krishna et al. | 250/206 |
| 2007/0146700 | A1* | 6/2007 | Kowarz et al. | 356/310 |
| 2009/0096895 | A1* | 4/2009 | Benezra et al. | 348/234 |
| 2012/0127301 | A1* | 5/2012 | Imai | 348/135 |
| 2012/0127334 | A1* | 5/2012 | Imai | 348/223.1 |

\* cited by examiner

*Primary Examiner* — Justin P Misleh
(74) *Attorney, Agent, or Firm* — Canon USA Inc IP Division

(57) ABSTRACT

A method for adaptive spectral image capture that may be performed via an image capture device is disclosed. A default capture parameter is applied to an imaging assembly and a sample image of a scene is captured by an image capture device. The sample image is analyzed to identify transition zones between multiple different regions. An initial guess as to which spectral regions a filter mode might work best is obtained based on dominant transition region spectrum and a first iterated step in which numerical values for the filter mode are calculated. A second iterated step in which each such filter mode is evaluated for effectiveness against other filter modes. The regions in which a specific filter mode works best becomes associated with the filer mode and these regions become the guess for the next iteration.

16 Claims, 11 Drawing Sheets

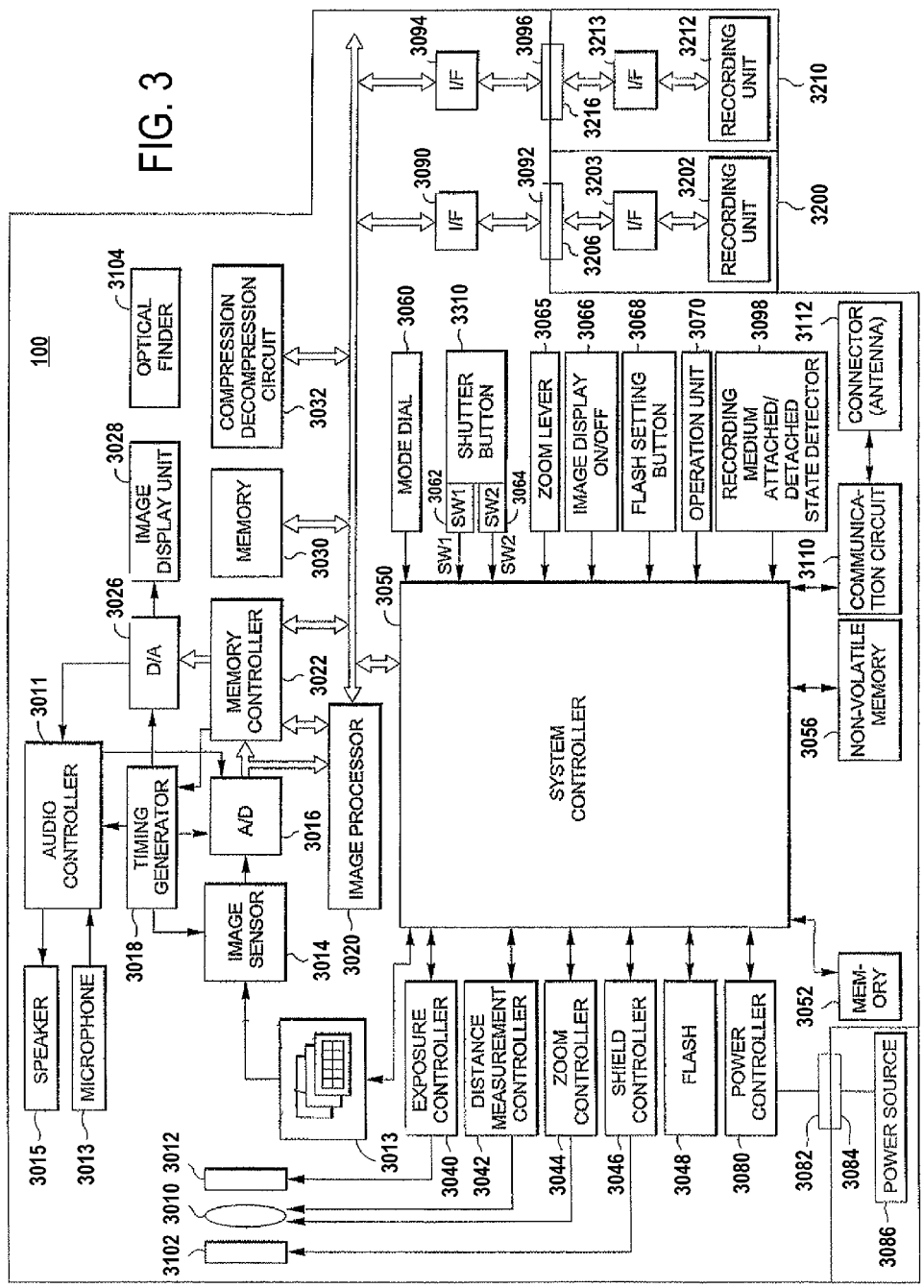

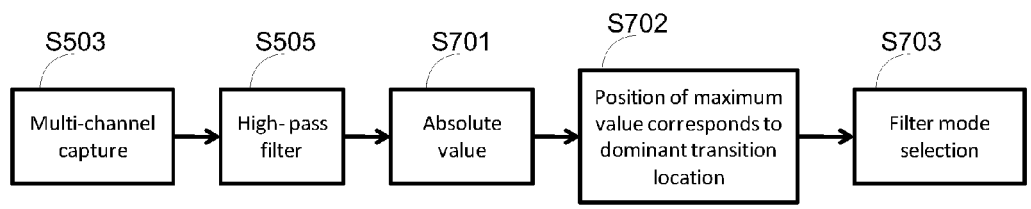
FIG. 8
| Filter Mode 1 | Filter Mode 2 | Filter Mode 3 |
FIG. 8A
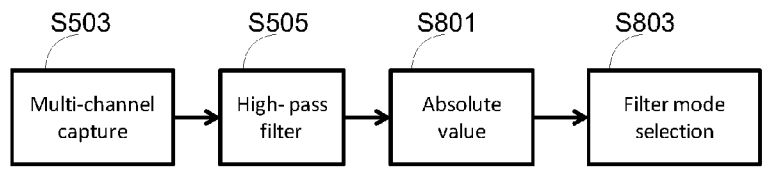
FIG. 9

EFFICIENT SPECTRAL IMAGING BASED ON IMAGING SYSTEMS WITH SCENE ADAPTATION USING TUNABLE COLOR PIXELS

CROSS REFERENCE TO RELATED APPLICATION

The present application is the non-provisional application of U.S. Provisional Patent Application No. 61/532,969, filed on Sep. 9, 2011, the content of which is expressly incorporated by reference herein in its entirety.

BACKGROUND

1. Field of the Disclosure

The present disclosure relates to image capture and device technologies that allow independent adjustment of the filtering for image regions by adapting to the image based on scene analysis.

2. Description of the Related Art

Traditionally, spectral imaging has relied on the use of a pre-determined set of filters that are mechanically or electronically adjusted to capture image bands with different spectral properties. Spectral imaging has been primarily confined to some niche high-end applications such as remote sensing and artwork analysis and archiving. Consumer level state-of-the-art spectral imaging systems are not readily available in the marketplace. This is due to several factors such as cost, complexity requiring fast computers, large data storage capacity, bulkiness of the imaging system and lack of a compelling application.

A typical spectral imaging system can be produced by combining an imaging detector with a filter wheel having color filters with different transmittances, or with liquid crystal tunable filters. A filter wheel has the disadvantage of being limited only to the existing filters in the filter wheel and the artifacts due to misregistration as a result of the mechanical movement of the filter wheel. On the other hand, electronic tuning using liquid crystal tunable filtering suffers from very low spectral transmittances that decrease the signal-to-noise ratio (SNR) of the imaging system. Thus, conventional spectral imaging systems have been hampered by a need to increase the number of captured signals to increase spectral resolution, reduce artifacts and increase SNR. Furthermore, spectral imaging systems are inherently by design very inefficient not just because of the tremendous redundancy in spectral information, but also because spectral imaging systems typically capture pre-determined channels regardless of whether or not there are meaningful information in the captured band. The capture of channels in areas of the images that there is no significant information in that spectral band leads to decrease in system SNR and consequently errors in spectral estimation.

SUMMARY

Briefly described, the present invention, in preferred embodiments thereof, is comprised of a method for adaptive spectral image capture that may be performed via an image capture device. The image capture device includes an imaging assembly having a spectral response that is tunable in accordance with a capture parameter. Initially, a default capture parameter is applied to the imaging assembly, wherein the default capture parameter has high spectral dimensionality. A sample image of a scene is captured by the image capture device and analyzed to identify transition zones between multiple different regions in the scene. Each of the multiple different regions may share similar spectral content that is dissimilar from spectral content in adjacent regions of the multiple different regions. Identification of a transition zone may comprise application of a high-pass filter to the sample image, so as to derive a preliminary estimate of the transition zone, selection of a filter mode from amongst a pre-designated collection of filter modes, wherein the selected filter mode may be selected based on color characteristics of the preliminary estimate of the transition zone, and application of the selected filter mode to the sample image. Numerical values for each filter mode may be calculated during a training period.

The training period may be determined by an iterative approach. An initial guess as to which spectral regions a filter mode might work best is obtained based on dominant transition region spectrum and a first iterated step in which numerical values for the filter mode are calculated from an estimate of spectral region in a prior iteration. A second iterated step in which each such filter mode is evaluated for effectiveness against other filter modes by comparing the ground truth with estimated spectral reflectance using the numerical values obtained in the previous step for the entire training set. The regions in which a specific filter mode works best becomes associated with the filer mode and these regions become the guess for the next iteration. This process is repeated with application of the previous steps until convergence of error towards the filter mode region meets a stopping condition.

Next, a spectral sensitivity of the imaging acquisition system is adjusted and the capture parameter is applied to the imaging assembly. Adjusting the spectral sensitivity of the imaging acquisition system includes shifting a peak wavelength of at least one sensitivity curves. A spectral image of the scene may now be captured and stored.

BRIEF DESCRIPTION OF THE DRAWINGS

The accompanying drawings, which are incorporated in and constitute a part of the specification, illustrate exemplary embodiments of the invention and, together with the description, serve to explain the principles as disclosed herein. Further features and aspects of the present disclosure will become apparent from the following detailed description of exemplary embodiments with reference to the attached drawings, in which like reference characters designate the same or similar parts throughout the figures thereof.

FIG. 3 is a block diagram showing an example embodiment of a multi-spectral digital camera.

FIG. 8 illustrates a block diagram of data flow for estimation of dominant transition locations used to determine which filter mode to apply.

FIG. 8A illustrates a division of maximum output values parsed into different filter mode assignments.

FIG. 9 illustrates a block diagram of data flow for estimation of dominant transition locations used to determine which filter mode to apply.

DETAILED DESCRIPTION OF THE DISCLOSURE

In the following example embodiments, there is described an image capturing device, such as a multi-spectral digital camera which may be a digital still camera or a digital video camera. The multi-spectral digital camera is configured to utilize methods and devices as disclosed herein to automatically determine an optimal spectral imaging for an image having at least one relevant region. The optimal spectral imaging is determined using an imaging capturing system having tunable spectral sensitivities. It is understood, however, that the following description encompasses arbitrary arrangements which can incorporate or utilize such imaging assemblies having a spectral response which is tunable in accordance with a capture parameter, for instance, a data processing apparatus having an image sensing function (e.g., a personal computer) or a portable terminal having an image sensing function (e.g., a mobile telephone).

Figure 1:
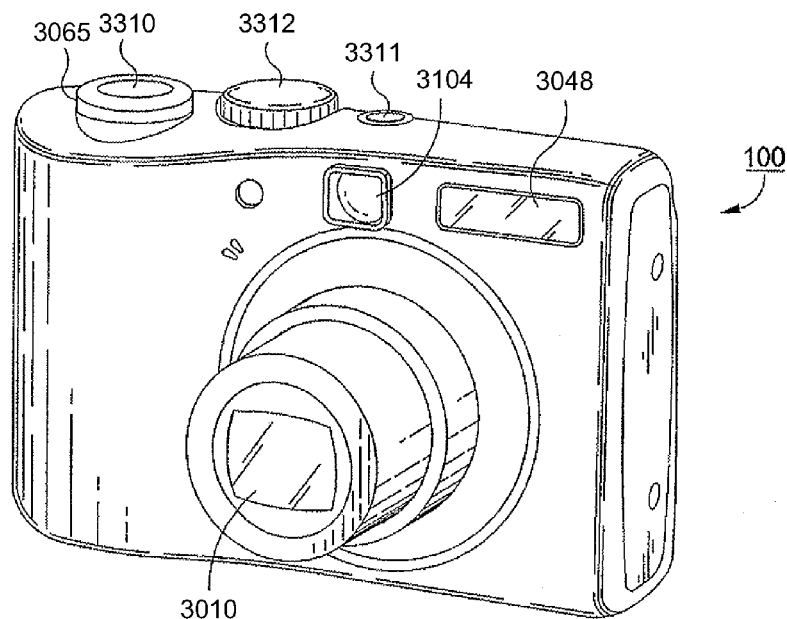
FIG. 1 is a view showing an external appearance of an example embodiment.
Figure 2:
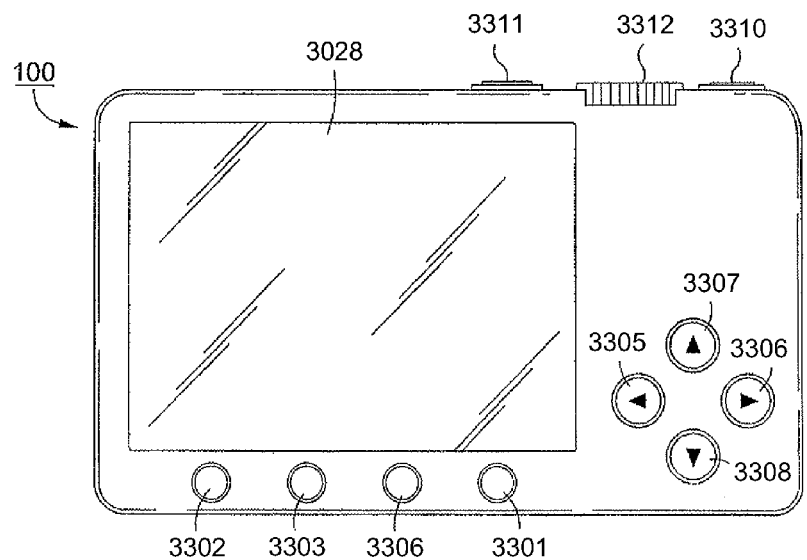
FIG. 2 is a view showing an external appearance of an example embodiment.

For clarity, a brief description of an image capturing device will be provided in the following paragraphs. FIGS. 1 and 2 are views showing an external appearance and functionality of the multi-spectral digital camera 100, as the image capturing device according to this embodiment. Note in these figures, some components are omitted for description purposes as they are not relevant to the ideas and concepts disclosed throughout this document. An operation unit 3070 (See FIG. 3) comprises, e.g., buttons and switches 3301 to 3311. A user operates these buttons and switches 3301 to 3311 for turning ON/OFF the power of the multi-spectral digital camera 100, for setting, changing or confirming the shooting parameters, for confirming the status of the camera, and for confirming shot images.

The power button 3311 is provided to start or stop the multi-spectral digital camera 100, or to turn ON/OFF the main power of the multi-spectral digital camera 100. The menu button 3302 is provided to display the setting menu such as shooting parameters and operation modes of the multi-spectral digital camera 100, and to display the status of the multi-spectral digital camera 100. The menu has, for example, a hierarchical structure, and each hierarchy includes selectable items or items whose values are variable.

A delete button 3301 is pressed for deleting an image displayed on a playback mode or a shot-image confirmation screen. In the present embodiment, the shot-image confirmation screen (a so-called quick review screen) is provided to display a shot image on the image display unit 3028 (See FIG. 3) immediately after shooting for confirming the shot result. Furthermore, the present embodiment is constructed in a way that the shot-image confirmation screen is displayed as long as a user keeps pressing the shutter button 3310 after the user instructs shooting by shutter button depression.

An enter button 3303 is pressed for selecting a mode or an item. When the enter button 3303 is pressed, the system controller 3050 (See FIG. 3) sets the mode or item selected at this time. The display ON/OFF button 3066 is used for selecting displaying or non-displaying of photograph information regarding the shot image, and for switching the image display unit 3028 to be functioned as an electronic view finder.

A left button 3305, a right button 3306, an up button 3307, and a down button 3308 may be used for the following purposes, for instance, changing an option (e.g., items, images) selected from plural options, changing an index position that specifies a selected option, and increasing or decreasing numeric values (e.g., correction value, date and time).

Half-stroke of the shutter button 3310 instructs the system controller 3050 to start, for instance, AF processing, AE processing, AWB processing, EF processing or the like. Full-stroke of the shutter button 3310 instructs the system controller 3050 to perform shooting.

The zoom operation unit 3065 is operated by a user for changing the angle of view (zooming magnification or shooting magnification) as mentioned above.

A recording/playback selection switch 3312 is used for switching a recording mode to a playback mode, or switching a playback mode to a recording mode. Note, in place of the above-described operation system, a dial switch may be adopted or other operation systems may be adopted.

FIG. 3 is a block diagram showing the arrangement of the multi-spectral digital camera 100 according to this embodiment. Referring to FIG. 3, reference numeral 3010 denotes an imaging lens; 3012, a shutter having an aperture function; and 3014, an image sensor which has a spectral response which is tunable in accordance with a capture parameter, which converts an optical image into an electrical signal. An A/D converter 3016 converts an analog signal into a digital signal. The A/D converter 3016 is used when an analog signal output from the image sensor 3014 is converted into a digital signal and when an analog signal output from an audio controller 3011 is converted into a digital signal. Reference numeral 3102 denotes a shield, or barrier, which covers the image sensor including the lens 3010 of the digital camera 100 to prevent an image capturing system including the lens 3010, shutter 3012, and image sensor 3014 from being contaminated or damaged.

In FIG. 3, an imaging assembly may be comprised of image sensor 3014 and associated optics, such that in some embodiments the imaging assembly is comprised of image sensor 3014 and lens 3010. A more detailed discussion of the imaging assembly is provided in subsequent paragraphs.

The optical system 3010 may be of a zoom lens, thereby providing an optical zoom function. The optical zoom function is realized by driving a magnification-variable lens of the optical system 3010 using a driving mechanism of the optical system 3010 or a driving mechanism provided on the main unit of the digital camera 100.

Reference numeral 3018 denotes a timing generator, which supplies clock signals and control signals to the image sensor 3014, the audio controller 3011, the A/D converter 3016, and a D/A converter 3026. The timing generator 3018 is controlled by a memory controller 3022 and system controller 3050. An image processor 3020 applies resize processing such as predetermined interpolation and reduction, and color conversion processing to data from the A/D converter 3016 or that from the memory controller 3022. The image processor 3020 executes predetermined arithmetic processing using the captured image data, and the system controller 3050 executes exposure control and ranging control based on the obtained arithmetic result.

As a result, TTL (through-the-lens) AF (auto focus) processing, AE (auto exposure) processing, and EF (flash pre-emission) processing are executed. The image processor 3020 further executes predetermined arithmetic processing using the captured image data, and also executes TTL AWB (auto white balance) processing based on the obtained arithmetic result. It is understood that in other embodiments, optical finder 3104 may be used in combination with the TTL arrangement or in substitution therefor.

Output data from the A/D converter 3016 is written in a memory 3030 via the image processor 3020 and memory controller 3022 or directly via the memory controller 3022. The memory 3030 stores image data which is captured by the image sensor 3014 and is converted into digital data by the A/D converter 3016, and image data to be displayed on an image display unit 3028. The image display unit 3028 may be a liquid crystal screen. Note that the memory 3030 is also used to store audio data recorded via a microphone 3013, still images, movies, and file headers upon forming image files. Therefore, the memory 3030 has a storage capacity large enough to store a predetermined number of still image data, and movie data and audio data for a predetermined period of time.

A compression/decompression unit 3032 compresses or decompresses image data by adaptive discrete cosine transform (ADCT), or the like. The compression/decompression unit 3032 loads captured image data stored in the memory 3030 in response to pressing of the shutter 3310 as a trigger, executes the compression processing and writes the processed data in the memory 3030. Also, the compression/decompression unit 3032 applies decompression processing to compressed image data loaded from a detachable recording unit 3202 or 3212, as described below, and writes the processed data in the memory 3030. Likewise, image data written in the memory 3030 by the compression/decompression unit 3032 is converted into a file by the system controller 3050, and that file is recorded in the recording unit 3202 or 3212, as also described below.

The memory 3030 may also serve as an image display memory (video memory). A D/A converter 3026 converts image display data stored in the memory 3030 into an analog signal and supplies that analog signal to the image display unit 3028. An image display unit 3028 makes a display according to the analog signal from the D/A converter 3026 on the liquid crystal screen 3028 of an LCD display. In this manner, image data to be displayed written in the memory 3030 is displayed by the image display unit 3028 via the D/A converter 3026.

The exposure controller 3040 controls the shutter 3012 having a diaphragm function based on the data supplied from the system controller 3050. The exposure controller 3040 may also have a flash exposure compensation function by linking up with a flash (flash emission device) 3048. The flash 3048 has an AF auxiliary light projection function and a flash exposure compensation function.

The distance measurement controller 3042 controls a focusing lens of the optical system 3010 based on the data supplied from the system controller 3050. A zoom controller 3044 controls zooming of the optical system 3010. A shield controller 3046 controls the operation of a shield (barrier) 3102 to protect the optical system 3010.

An audio signal output from the microphone 3013 is supplied to the A/D converter 3016 via the audio controller 3011 which includes an amplifier and the like, is converted into a digital signal by the A/D converter 3016, and is then stored in the memory 3030 by the memory controller 3022. On the other hand, audio data is loaded from the memory 3030, and is converted into an analog signal by the D/A converter 3026. The audio controller 3011 drives a speaker 3015 according to this analog signal, thus outputting a sound.

A nonvolatile memory 3056 is an electrically erasable and recordable memory, and uses, for example, an EEPROM. The nonvolatile memory 3056 stores constants, computer-executable programs, and the like for operation of system controller 3050. Note that the programs include those for execution of various flowcharts.

Figure 3A:
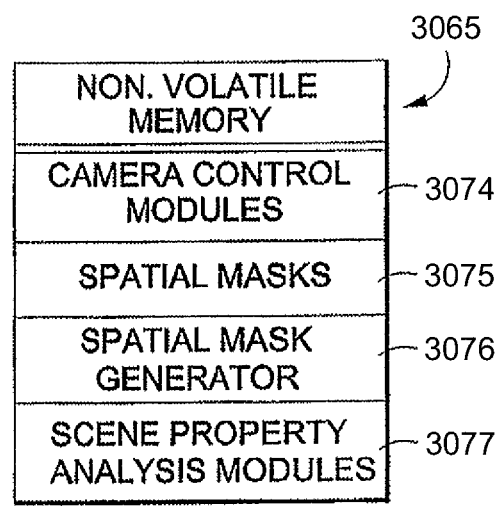
FIG. 3A is a view for explaining the architecture of modules according to an example embodiment.

In particular, and as shown in FIG. 3A, non-volatile memory 3056 is an example of a non-transitory computer-readable memory medium, having stored thereon camera control modules 3074 as described herein. Also stored thereon are pre-designated capture parameters for application to image sensor 3014 so as to control spectral responsivity of the image sensor. In this embodiment, the capture parameters are comprised of spatial masks 3075 so as to permit pixel-by-pixel or region-by-region control of spectral responsivity, independently of other pixels or regions. A spatial mask generator 3076 generates masks, such as by providing one of pre-designated masks 3075 or by deriving a new mask. The derived mask may be based on a comparison of scene properties as provided by scene property analysis module 3077.

A system controller 3050 controls the entire digital camera 100. The system controller 3050 executes programs recorded in the aforementioned nonvolatile memory 3056 to implement respective processes to be described later of this embodiment. Reference numeral 3052 denotes a system memory which comprises a RAM. On the system memory 3052, constants and variables required to operate system controller 3050, programs read out from the nonvolatile memory 3056, and the like are mapped.

A mode selection switch 3060, shutter switch 3310, and operation unit 3070 form operation means used to input various operation instructions to the system controller 3050. The mode selection switch 3060 includes the imaging/playback selection switch, and is used to switch the operation mode of the system controller 3050 to one of a still image recording mode, movie recording mode, playback mode, and the like.

The shutter switch 3062 may be turned on in the middle of operation (e.g. half stroke) of the shutter button 3310 arranged on the digital camera 100, and generates a first shutter switch signal SW1. Also, the shutter switch 3064 is turned on upon completion of operation (e.g. full stroke) of the shutter button 3310, and generates a second shutter switch signal SW2. The system controller 3050 starts the operations of the AF (auto focus) processing, AE (auto exposure) processing, AWB (auto white balance) processing, EF (flash pre-emission) processing, and the like in response to the first shutter switch signal SW1. Also, in response to the second shutter switch signal SW2, the system controller 3050 starts a series of processing (shooting) including the following: processing to read image signals from the image sensing device 3014, convert the image signals into image data by the A/D converter 3016, process the image data by the image processor 3020, and write the data in the memory 3030 through the memory controller 3022; and processing to read the image data from the memory 3030, compress the image data by the compression/decompression circuit 3032, and write the compressed image data in the recording medium 3200 or 3210.

A zoom operation unit 3065 is an operation unit operated by a user for changing the angle of view (zooming magnification or shooting magnification). The operation unit 3065 can be configured with, e.g., a slide-type or lever-type operation member, and a switch or a sensor for detecting the operation of the member.

The image display ON/OFF switch 3066 sets ON/OFF of the image display unit 3028. In shooting an image with the optical finder 3104, the display of the image display unit 3028 configured with a TFT, an LCD or the like may be turned off to cut the power supply for the purpose of power saving.

The flash setting button 3068 sets and changes the flash operation mode. In this particular embodiment, the settable modes may include include: auto, flash-on, red-eye reduction auto, and flash-on (e.g. red-eye reduction). In the auto mode, flash is automatically emitted in accordance with the lightness of an object. In the flash-on mode, flash is always emitted whenever shooting is performed. In the red-eye reduction auto mode, flash is automatically emitted in accordance with lightness of an object, and in case of flash emission the red-eye reduction lamp is always emitted whenever shooting is performed. In the flash-on (e.g. red-eye reduction) mode, the red-eye reduction lamp and flash are always emitted.

The operation unit 3070 comprises various buttons, touch panels and so on. More specifically, the operation unit 3070 includes a menu button, a set button, a macro selection button, a multi-image reproduction/repaging button, a single-shot/ serial shot/self-timer selection button, a forward (+) menu selection button, a backward (−) menu selection button, and the like. Furthermore, the operation unit 3070 may include a forward (+) reproduction image search button, a backward (−) reproduction image search button, an image shooting quality selection button, an exposure compensation button, a date/ time set button, a compression mode switch and the like.

The compression mode switch is provided for setting or selecting a compression rate in JPEG (Joint Photographic Expert Group) compression, recording in a RAW mode and the like. In the RAW mode, analog image signals outputted by the image sensing device are digitalized (RAW data) as it is and recorded.

Note in the present embodiment, RAW data includes not only the data obtained by performing A/D conversion on the photoelectrically converted data from the image sensing device, but also the data obtained by performing lossless compression on A/D converted data. Moreover, RAW data indicates data maintaining output information from the image sensing device without a loss. For instance, RAW data is A/D converted analog image signals which have not been subjected to white balance processing, color separation processing for separating luminance signals from color signals, or color interpolation processing. Furthermore, RAW data is not limited to digitalized data, but may be of analog image signals obtained from the image sensing device.

According to the present embodiment, the JPEG compression mode includes, e.g., a normal mode and a fine mode. A user of the digital camera 100 can select the normal mode in a case of placing a high value on the data size of a shot image, and can select the fine mode in a case of placing a high value on the quality of a shot image.

In the JPEG compression mode, the compression/decompression circuit 3032 reads image data written in the memory 3030 to perform compression at a set compression rate, and records the compressed data in, e.g., the recording medium 3200.

In the RAW mode, analog image signals are read in units of line in accordance with the pixel arrangement of the color filter of the image sensing device 3014, and image data written in the memory 3030 through the A/D converter 3016 and the memory controller 3022 is recorded in the recording medium 3200 or 3210.

Note that the multi-spectral digital camera 100 according to the present embodiment may have a plural-image shooting mode, where plural image data can be recorded in response to a single shooting instruction by a user. Image data recording in this mode includes image data recording typified by an auto bracket mode, where shooting parameters such as white balance and exposure are changed step by step. It also includes recording of image data having different post-shooting image processing contents, for instance, recording of plural image data having different data forms such as recording in a JPEG form or a RAW form, recording of image data having the same form but different compression rates, and recording of image data on which predetermined image processing has been performed and has not been performed.

A power controller 3080 comprises a power detection circuit, a DC-DC converter, a switch circuit to select the block to be energized, and the like. The power controller 3080 detects the existence/absence of a power source, the type of the power source, and a remaining battery power level, controls the DC-DC converter based on the results of detection and an instruction from the system controller 3050, and supplies a necessary voltage to the respective blocks for a necessary period. A power source 3086 is a primary battery such as an alkaline battery or a lithium battery, a secondary battery such as an NiCd battery, an NiMH battery or an Li battery, an AC adapter, or the like. The main unit of the multi-spectral digital camera 100 and the power source 3086 are connected by connectors 3082 and 3084 respectively comprised therein.

The recording media 3200 and 3210 may comprise: recording units 3202 and 3212 that may be configured with semiconductor memories, magnetic disks and the like, interfaces 3203 and 3213 for communication with the multi-spectral digital camera 100, and connectors 3206 and 3216. The recording media 3200 and 3210 are connected to the multi-spectral digital camera 100 through connectors 3206 and 3216 of the media and connectors 3092 and 3096 of the digital camera 100. To the connectors 3092 and 3096, interfaces 3090 and 3094 are connected. The attached/detached state of the recording media 3200 and 3210 is detected by a recording medium attached/detached state detector 3098.

Note that although the multi-spectral digital camera 100 according to the present embodiment may comprise two systems of interfaces and connectors for connecting the recording media, a single or plural arbitrary numbers of interfaces and connectors may be provided for connecting a recording medium. Further, interfaces and connectors pursuant to different standards may be provided for each system.

For the interfaces 3090 and 3094 as well as the connectors 3092 and 3096, cards in conformity with a standard, e.g., PCMCIA cards, compact flash (CF) (registered trademark) cards and the like, may be used. In this case, connection utilizing various communication cards can realize mutual transfer/reception of image data and control data attached to the image data between the digital camera and other peripheral devices such as computers and printers. The communication cards may include, for instance, a LAN card, a modem card, a USB card, an IEEE 1394 card, a P1284 card, a SCSI card, and a communication card for PHS, or the like.

The optical finder 3104 is configured with, e.g., a TTL finder, which forms an image from the light beam that has gone through the lens 3010 utilizing prisms and mirrors. By utilizing the optical finder 3104, it is possible to shoot an image without utilizing an electronic view finder function of the image display unit 3028. The optical finder 3104 includes indicators, which constitute part of the display device 3054, for indicating, e.g., a focus state, a camera shake warning, a flash charge state, a shutter speed, an f-stop value, and exposure compensation.

A communication circuit 3110 provides various communication functions such as USB, IEEE 1394, P1284, SCSI, modem, LAN, RS232C, and wireless communication. To the communication circuit 3110, a connector 3112 can be connected for connecting the multi-spectral digital camera 100 to other devices, or an antenna can be provided for wireless communication.

A real-time clock (RTC, not shown) may be provided to measure date and time. The RTC holds an internal power supply unit independently of the power supply controller 3080, and continues time measurement even when the power supply unit 3086 is OFF. The system controller 3050 sets a system timer using a date and time obtained from the RTC at the time of activation, and executes timer control.

The image sensor 3014 may be a multi-spectral image sensor which has a spectral response that is tunable in accordance with a capture parameter 3017. For each pixel, the image sensor 3014 outputs five or more channels of color information, which may include, for example, a red-like channel, a green-yellow-like channel, a green-like channel, a blue-green-like channel, and a blue-like channel. The precise nature of the spectral responsivity of image sensor 3014 is controlled via the capture parameter 3017. In this embodiment, the capture parameter 3017 may be comprised of multiple spatial masks, with one mask each for each channel of information output by image sensor 3014. Thus, in this example, where image sensor 3014 outputs five or more channels, capture parameter 3017 includes a spatial mask DR for the red-like channel of information, a spatial mask DGY for the green-yellow-like channel of information, a spatial mask DG for the green-like channel of information, a spatial mask DBG for the blue-green-like channel of information and a spatial mask DB for the blue-like channel of information. Each spatial mask comprises an array of control parameters corresponding to pixels or regions of pixels in image sensor 3014. The spectral responsivity of each pixel, or each region of plural pixels, is thus tunable individually and independently of other pixels or regions of pixels.

Described above and in connection with FIGS. 1-3A is but one configuration of an image capturing device 100 that may be used in practice with the concepts and ideas disclosed herein. Other image capturing devices may be suitable and this disclosure is not limited to the image capturing device 100 disclosed in FIGS. 1-3A.

In operation, a light beam (e.g. a light beam incident upon the angle of view of the lens) from an object in a scene that goes through the optical system (image sensing lens) 3010 passes through an opening of a shutter 3012 having a diaphragm function and forms an optical image of the object on the image sensing surface of the image sensor 3014. The image sensor 3014 converts the optical image to analog image signals and outputs the signals to an A/D converter 3016. The A/D converter 3016 converts the analog image signals to digital image signals (image data). The image sensor 3014 and the A/D converter 3016 are controlled by clock signals and control signals provided by a timing generator 3018. The timing generator 3018 is controlled by a memory controller 3022 and a system controller 3050.

Figure 4:
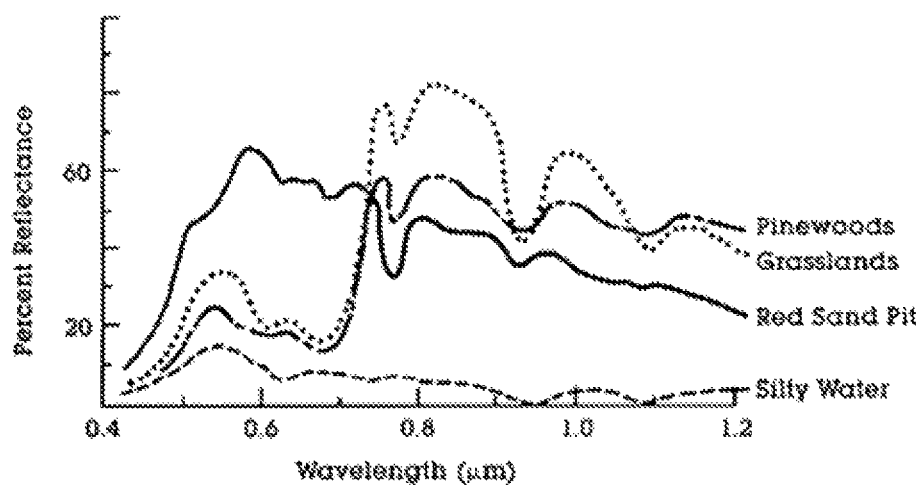
FIG. 4 is a graphical representation of the spectral reflectance of several different objects.

The light beam will carry information regarding the reflectance of the object in the scene. Depending on the material(s) and/or the object(s), the reflected electromagnetic spectrum may vary significantly across the viewable range of wavelengths or frequencies. FIG. 4 provides a graphic representation of typical reflectance curves for several objects or terrains, including pinewoods, grasslands, red sand pit and silty water. The wavelength of the visible portion of the electromagnetic spectrum ranges from about 0.4 micrometers ($\mu$m), which corresponds to the color violet, to about 0.7 $\mu$m, which corresponds to red. The infrared portion of the electromagnetic spectrum corresponding from greater than 0.7 $\mu$m to about 1.2 $\mu$m. Each of the objects or scenes illustrated has a predominant percentage reflectance. For example, the red sand pit is seen as having a predominant percentage reflectance of about 0.6 $\mu$m, which would correspond to red and/or orange in color. The predominant percentage reflectance can be thought of as the region of the visible spectrum where the majority of information about the object or scene may is contained. It is desirable that the image sensor 3014 detects, or senses, as much of the object or scene information as possible that is carried by the light beam and in an efficient manner. However, because the object or scene may contain large amount of information, it may be necessary to reduce the amount of collected information via the use of filters, or a filter system. Different pixel sensitivities are optimal for different reflectances. For example, when the reflectance is predominantly red, it is more useful to have more sensitivities capture the shorter wavelengths, since most of the information is there.

In practice, current spectral imaging systems have relied on the use of pre-determined set of filters that are mechanically or electronically adjusted to capture image bands with different spectral properties. Spectral imaging systems are inherently by design inefficient not just because of the redundancy in spectral information, but also because spectral imaging systems typically capture pre-determined channels regardless if there are meaningful information in the captured band. It may be possible to make improvements in terms of miniaturization of reconfigurable spectral imaging devices by exploring imaging sensors with tunable spectral sensitivities and will be discussed herein.

A new type of imaging sensor has been proposed whose spectral sensitivities can be tuned by changing the sensitivities of the sensors themselves. One possible way to achieve electronic tunability of sensitivity of the sensors is by using a Transverse Field Detector (TFD).

The TFD takes advantage of the light absorption properties of Silicon. An optical property of Silicon is that it absorbs different wavelengths of light depending on different depths. Thus, the lower portions of a sensor will likely absorb longer wavelengths compared to the upper portions of the sensor. By connecting surface electrodes, which produce transverse electric fields throughout the substrate that take advantage of the drift property of electrons, each electrode will then attract electrons coming from different depths in the Silicon. Since electrons coming from different depths in the Silicon are excited by different wavelengths of light, the electrodes can effectively capture the response from different wavelengths of light. By tuning these electrodes, which modify the drift properties of electrons, different absorption spectrums can be obtained. It has been shown that such a sensor could be effective not only for white balance adjustment, but also for reconfiguring an imaging sensor for illumination level. Each pixel may be configured to output signals, for example, a red-like channel, a green-like channel and a blue like channel. Therefore, the TFD can be used to measure the color of incident light without any color filter.

Figure 5:
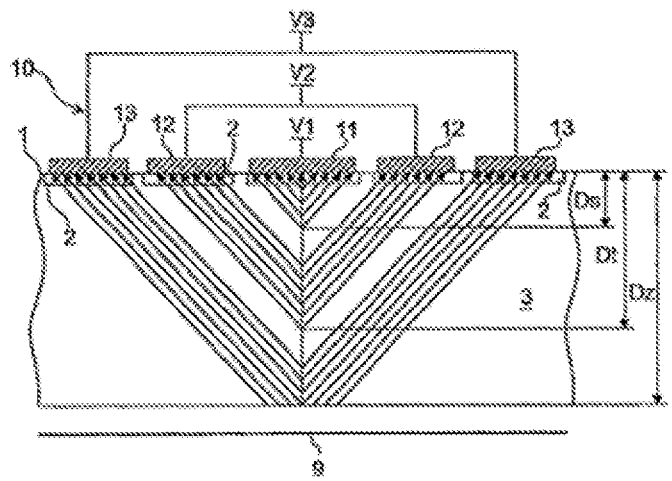
FIG. 5 is a schematic view of a cross section of a Transverse Field Detector (TFD) pixel which is photosensitive to light of different wavelengths.

Imaging assemblies have been developed wherein the imaging assemblies themselves have a tunable spectral response. The Transverse Field Detector (TFD), such as the one illustrated in FIG. 5, is an imaging assembly that can have a tunable spectral responsivity and be adjusted by application of bias voltages to control electrodes 11, 12, 13. FIG. 5 is a schematic view of a cross section of a TFD three channel pixel. As shown in FIG. 5, symmetric biasing is applied such that control electrodes 12 each receive the same bias voltage, and control electrodes 13 each receive the same bias voltage. Image sensor 3014 may be comprised of the TFD sensor as discussed herein. However, by utilizing a non-symmetric electric biasing on the TFD, it is possible to increase the number of captured channel from 3 to 5, or more depending on the circuit design of the sensor. A TFD having an increased number of captured channels may eliminate the necessity of a color filter array and therefore reduces the overall complexity of the system. Thus, by using a tunable spectral imaging sensor, it may be possible to develop a reconfigurable spectral imaging system that adapts to the content of the scene, increasing capture efficiency.

Specific spectral bands are more appropriate for certain reflectances of the scene. If a region of the scene is predominantly red, then it is more appropriate to have pixel sensitivities absorb more red light. Thus, depending on the reflectance of the scene in various regions, the TFD sensor can be potentially tuned to be optimized for the specific reflectance in those regions. Moreover, due to the nature of tunable imaging sensors, each pixel site can capture data for multiple color channels, eliminating the need for demosaicing on the final image allowing for much higher resolution multispectral images to be captured. The final result is a tunable sensor system which allows for improved performance over traditional multispectral imaging systems.

Referring to FIG. 5, the single pixel as described herein is illustrated as a component of an image assembly, or detector, comprised of a two-dimensional array of identical pixels is shown. The image assembly may comprise an electrode 9 arranged on the lower surface of the photosensitive structure and a plurality of control electrodes 11, 12, 13 arranged on the upper surface, the surface adjacent to a p-n junction 2, of the single pixel, and having a different voltage value. In this manner, resulting electric fields having different value are generated, leading the carriers generated by different wavelength photons to the surface along different trajectories.

A different color will correspond to each photon wavelength and a different portion of the chromatic spectrum will correspond to each collecting electrode. Thus, different chromatic components may be discriminated on the basis of known dependence of the absorption depth of photons on the wavelength. The correspondence between spectral region and carrier collecting electrode may simply be rearranged by changing the voltage pattern of the electrodes both statically and dynamically. A linear combination of the information obtained from the measurement of the electrical signals provided by the single electrodes permits a user to obtain the position of the spot which is representative of the color of the radiation incident in a Red, Green, Blue (RGB) space, for example. A two-dimensional array of these pixels therefore returns a color image.

The plurality of control electrodes 11, 12, 13 may comprise a first control electrode 11 arranged in a central position, adjacent to a central region having a different conductivity from the substrate and adjusted with a voltage V1, two electrodes 12 arranged with respect to the first electrode 11 and adjacent to two regions having a different conductivity from the substrate and adjusted with a voltage V2 which is different from V1, other two electrodes 13 arranged with respect to the first electrode 11 at a greater distance of the electrodes 12 and adjacent to two regions 13 having a different conductivity from the substrate and adjusted with a voltage V3 such that V3 is different from V1 and V2. In this manner, for example, an RGB sensor may be made, in which the electrode 11 detects the color blue, the electrodes 12 detect the color green and the electrodes 13 detect the color red. Other electrodes displaying other adjustment voltages may be added in order to detect a finer subdivision of the spectrum. The electrode 11 is adapted to collect the carriers which are generated up to a depth Ds, the electrodes 12 are adapted to collect the generated carriers up to a depth Dt and the electrodes 13 are adapted to collect the generated carriers up to a depth Dz.

In particular, in such a three channel TFD, symmetric biasing is applied such that related pairs of electrodes each receive the same bias voltage. A TFD with more than three channels can be provided by applying an asymmetric biasing to a symmetric TFD pixel and increase the number of acquisition spectra in the same pixel. For example, asymmetric biasing could be applied to the TFD pixel shown, such that control electrodes 12 each receive a different bias voltage, and control electrodes 13 each receive a different bias voltage. Thus, by applying asymmetric biasing, each of the five electrodes of the TFD pixel could receive a different bias voltage, thereby providing for five channels that can each be tuned to different spectral sensitivities. Therefore, the biasing of the voltages can dictate the spectral sensitivity selected. For example, spatial masks DR, DGY, DG, DBG and DB may correspond to non-symmetric voltage biases applied to control electrodes of the TFD sensor.

Figure 5A:
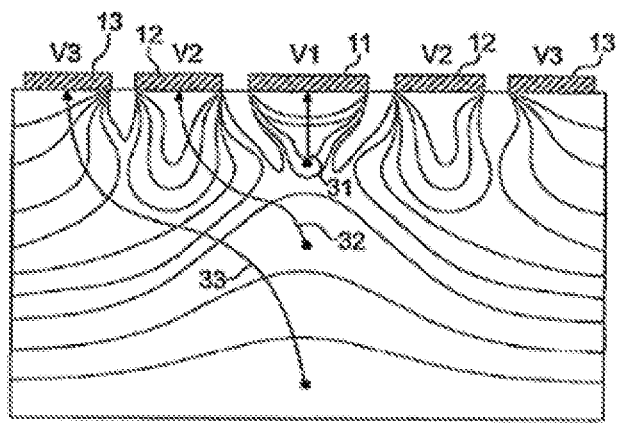
FIG. 5A is a diagram of equipotential lines for the TFD of FIG. 5.

FIG. 5A shows an equipotential line diagram for the image assembly in FIG. 5. Since the force lines of the electrical field are always in a direction orthogonal to the equipotential lines, the possible carrier trajectories are obtained. Lines 31, 32 and 33 are some of the possible trajectories of the carriers which are separated according to the different generation depth and a different color. Therefore, the TFD can be tuned to detect different components of the electromagnetic spectrum by adjusting the bias voltages and the number of components detectable can be increased or decreased by adjusting the symmetry of the bias voltages.

By using a tunable spectral imaging sensor, such as TFD, it is possible to produce a reconfigurable spectral imaging system that adapts to the content of the scene, increasing capture efficiency. Specific spectral bands are more appropriate for certain reflectances of the scene. For example, if a region of the scene is predominantly red, then it is more appropriate to have pixel sensitivities absorb more red light. Thus, depending on the reflectance of the scene in various regions, the sensor can be tuned to be optimized for the specific reflectance in those regions. Furthermore, the imaging system as disclosed herein may be tuned based on an adaptation to the color content of the capturing scene by performing image analysis of a captured preview. In practice, tunable sensors such as the TFD cannot be arbitrarily tuned due to device constraints. A completely tunable system that considers a finite collection of sets of spectral sensitivities (i.e. a system having a spectral dimensionality of five or more) is discussed herein. Each set of spectral sensitivities will be understood by the skilled artisan to be a "filter mode." Thus, the set of spectral sensitivities biased toward red regions of the scene would be an example of a filter mode.

Figure 6A:
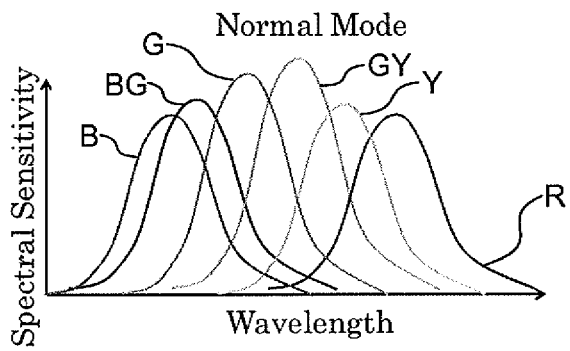
FIGS. 6A-6C are representative filter mode spectrums.
Figure 6B:
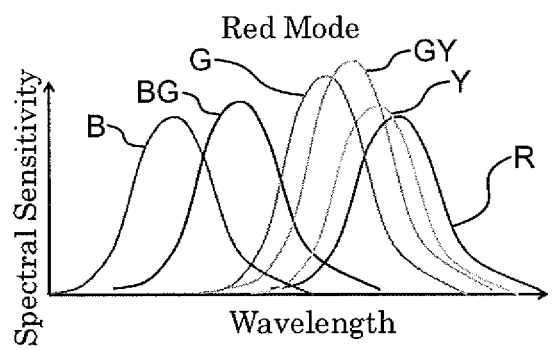
Figure 6C:
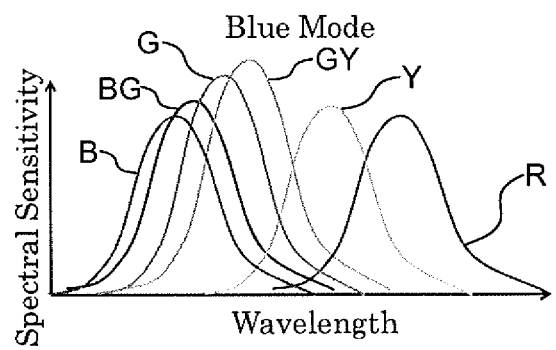

One possible way to bias spectral sensitivities is by applying weights that shifts the sensitivities either towards short or long wavelengths. In this disclosure, seven different filter modes were investigated since seven filter modes would cover a wide range of colors. The seven different filter modes applied are specialized for the following colors: red (approximately 0.6 to 0.65 µm), green (approximately 0.5 to 0.55 µm), blue (approximately 0.45 to 0.5 µm), yellow (approximately 0.55 to 0.6 µm), long-red (approximately 0.65 to 0.7 µm) and short-blue (approximately 0.4 to 0.45 µm). Moreover, a default filter mode is left in place for all other cases. A default filter mode corresponds to sensitivities that may be found typically in existing multispectral cameras today by equally sampling the visible spectrum, which show no bias towards specific wavelengths (See FIG. 6A). The red mode (See FIG. 6B) corresponds to sensitivities that are more densely sampled in longer wavelengths. The blue mode (See FIG. 6C) corresponds to sensitivities that are more densely sampled in shorter wavelengths. A default capture parameter (spatial electronic mask) may be applied to an imaging assembly having a spectral response which is tunable in accordance with the capture parameter. The spatial electronic mask determines the spectral sensitivities of the sensor for each region. The initial electronic mask could be dictated by the default filter mode that could be, for instance, the normal mode (See FIG. 6A). A preview image of a scene is captured and the sample image is analyzed. The optimal filter mode to use is determined based on the scene, on a region-by-region basis. See FIGS. 6A-6C for an illustration of different exemplary filter modes. The curves in lower wavelength correspond to signals that are blue in nature. The curves with higher values of wavelength correspond to signals that are red in nature. Additional filter modes are similarly biased towards different areas of the spectrum. FIGS. 6A-6C will be understood by the skilled artisan to be one possible representation of a "Normal Mode", a "Red Mode" and a "Blue Mode" respectively. The amplitude and placement of the curves (e.g., B=blue, BG=blue-green, G=green, GY=green-yellow, Y=yellow and R=red) are exemplary amplitudes and placements of the respective colors given a particular mode.

From the image information collected, a spectral mask is constructed for each filter mode. The spectral masks are applied as capture parameters to the imaging assembly by adjusting the bias voltages to each pixel location. Alternatively, the biasing voltages could be determined from a pre-populated look up table (LUT). In particular, the LUT may be comprised of predetermined spectral signatures that maps digital count levels for each channel to a corresponding spectral reflectance.

Optimal filter mode selection is anticipated given an initial preview of the image. There are many possible ways to anticipate the optimal filter mode. A simple way is to simply calculate the first derivative of the data collected from the channel read-outs from the different sensor channels. The first derivative will provide the slope of the curves generated by the data. A large (either positive or negative) value for the first derivative will indicate a rapid increase or decrease in the curves. The first derivative is used since it is desired to concentrate the sensitivity curves near sharp drop-offs in the radiance. Once the first derivate has been determined for the collected data (See FIG. 7, step S511), the position of maximum transition (i.e. a location having the largest first derivative in magnitude) is known and can be used to determine which filter mode will optimize a particular region of the object or scene. For example, if the maximum first derivative occurs near the blue spectrum, a blue mode filter (i.e. FIG. 6C) is a candidate as the optimum selection.

Although the previously mentioned method is simple and intuitive, in practice it is difficult to train and utilize, especially on larger amounts of filter modes. A more practical method may be to use the first derivative of the channel read-outs as features. Next, feed these features into a linear, 1-vs-all support vector machine (SVM). Since the training data has access to the ground truth reflectance, we can determine which filter mode is the most suitable, and use this for training of the SVM.

Figure 7:
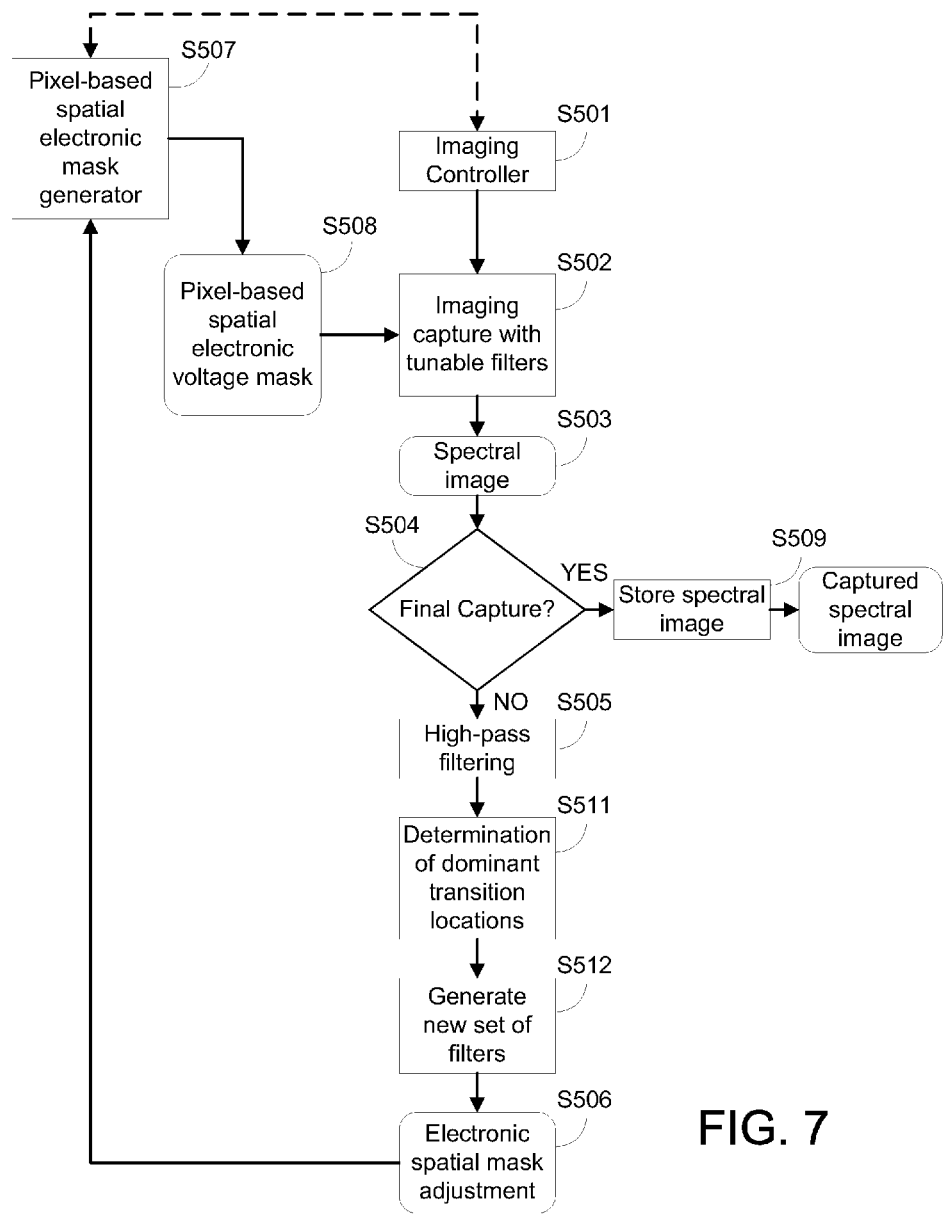
FIG. 7 is a flow diagram for explaining an example embodiment of a spectral image capture and analysis of a scene.

FIG. 7 is a flow diagram for explaining an example embodiment of an efficient adaptive image capture of a scene in which spectral selectivity is adjusted on a pixel-by-pixel basis, or a region-by-region basis, for imaging sensors with tunable spectral properties to increase spectral differentiation for spectral content in a scene.

According to FIG. 7, a flow diagram for explaining a method of image capture of a scene in which spectral selectivity is adjusted on a region-by-region basis, for imaging sensors with tunable spectral properties, so as to increase spectral differentiation for spectral content in the scene is presented. A default capture parameter is provided and has high spectral dimensionality. A sample image of a scene is captured and the sample image is analyzed to identify multiple different regions in the scene. Each such region shares similar spectral content that is dissimilar from spectral content in other regions of the scene. Spectral bands for each region of the multiple different regions are determined. The spectral bands are determined so as to increase spectral differentiation for spectral content in each such region. A spectral mask is constructed for application to the imaging assembly. The spectral mask is constructed from the spectral bands for the multiple different regions. The spectral mask is applied as the capture parameter to the imaging assembly, and a spectral image of the scene is captured and stored.

In step S501, an imaging controller controls spatial electronic mask generator 3076 to set-up an initial state for a pixel-by-pixel basis spatial electronic voltage mask that is going to modulate the amplitude and spectral selectivity of an imaging sensor with tunable color sensitivities. The electronic mask can control amplitude and spectra tuning for each pixel. The initial state for the pixel-by-pixel basis spatial mask is given by electronic voltages that have some assumptions about illumination and material properties of the scene. The default capture parameter includes this initial state for the pixel-by-pixel basis spatial mask. A preview image is captured using the default spectral sensitivities for the tunable sensors. In the example embodiment, this capture parameter has high spectral dimensionality, e.g., a spectral dimensionality of five or more.

In steps S502 and S503, the image controller sends a command to tune the imaging sensor in accordance with the default capture parameter and capture a spectral image. In the example embodiment, the default capture parameter corresponds to the signals to produce the arrangement of pixels in the imaging sensor to produce a default capture parameter as illustrated such that the imaging sensor has color channels for five different spectral sensitivities, and thus has a spectral dimensionality of five.

In step S504, the scene property analysis module 3077 determines whether the captured spectral image is the final image. In the example embodiment, the scene property analysis module 3077 determines whether the captured spectral image is the final image based on a user input. For example, if the shutter is half-pressed, then it is determined that the shooting mode is an analysis mode, and if the shutter is full-pressed, then it is determined that the shooting mode is not the analysis mode. If the spectral image was captured in the analyses mode, then it is not the final image.

If the scene property analysis module 3077 determines that the captured image is the final image ("YES" in step S504), then the captured spectral image is stored (step S509).

If the scene property analysis module 3077 determines that the captured image is not final image ("NO" in step S504), then processing proceeds to step S505. In step S505, a high pass filter is applied to each of the color channels of the result. Ideally, there will be the same number of data points as color channels. The high-pass filter, for example, is an electronic filter that passes high-frequency signals but attenuates (i.e. reduces the amplitude of) signals with frequencies lower than the cutoff frequency.

In particular, the digital signal for each channel in each pixel is analyzed to determine the spectral signature for each pixel. For instance, the imaging sensor may be tuned such that each pixel has five channels with sensitivities centered in wavelengths which divide the visible spectrum of light with substantially equal levels of sensitivity for each channel, although it is not required that the visible spectrum of light be divided with substantially equal levels of sensitivity for each channel.

In particular, in the example embodiment in which each pixel has five channels, each pixel is integrated to produce five digital signals, one signal for each channel. As described above, each channel is tuned to a spectral band within the visible spectrum. Therefore, the digital signal for each channel corresponds to a respective spectral band within the visible spectrum.

Contiguous pixels with similar spectral signatures are clustered into regions of the captured scene, wherein each such region shares similar spectral content that is dissimilar from spectral content in other regions of the scene.

For each region, new spectral bands are determined so as to increase spectral differentiation for spectral content in the region. For example, for a region with a dark blue spectral signature, there is not much additional information captured by acquiring the Green-Yellow and Red channels. Therefore, the imaging capturing system with tunable sensitivities is adjusted for the dark blue spectral signature region to increase the sensitivities for the Blue, Blue-Green and Green channels, and by doing so, it is possible to obtain more meaningful spectral selection and to increase signal-to-noise ratio.

Returning to the description of FIG. 7, in step S511, dominant transition locations are determined or estimated and used as the basis for filter selection. With the dominant transition locations determined, the appropriate filter mode(s) may be selected or generated. Dominant transition locations can be calculated via one of several algorithms.

One algorithm, illustrated in FIG. 8, relies on the determination of a maximum value, or several maximum values, of the high-pass filtered version of the original signal data. In most instances, steps S701-S703 will constitute step S511, the determination of dominant transition locations as shown in FIG. 7. The absolute value of the high-pass filtered version of the original signal data is calculated in step S701. In some cases, it may be more appropriate that the maximum absolute value may be determined. However, it is not required that the absolute value of the high-pass filtered version of the original signal data be calculated and is optional but may be beneficial for reasons relating to computation. In step S702, the position of the maximum absolute value will correspond to the dominant transition location. Once the dominant transition location is known, as well as the value of the dominant transition location, the appropriate filter mode, or modes, may be selected according to step S703. For example, if the dominant transition occurs in the red portion of the spectrum, a filter mode tailored to these types of reflectances may be used. Step S703 may consist of any mapping from the output values determined in step S702 into filter mode assignments as long as all possible output values from step S702 are considered in the mapping.

For example, a simple embodiment of step S702 of the algorithm may be described as follows. FIG. 8A shows a range of all maximum values from step S702. Step S703 will then divide this range of maximum values into different filter modes and be assigned to the system assign. For example, let x be the maximum value from step S702 of a system that is a 3 filter mode system. Let $x_1 < x_2 < x_3 < x_4$. If $x_1 < x < x_2$, then assign the current pixel to use Filter Mode 1. If $x_2 < x < x_3$, then assign the current pixel to use Filter Mode 2. If $x_3 < x < x_4$, then assign the current pixel to use Filter Mode 3. The constants, $x_1$, $x_2$, $x_3$, and $x_4$, may be determined experimentally during a training period.

In an alternate implementation of this algorithm, a machine learning algorithm may be employed to learn the mapping from the maximum values of step S702 to the filter modes of step S703. The maximum location (i.e. the output from step S702) and/or maximum value are used as features, in attempts to predict the optimal filter mode, based on this information. Any machine learning algorithm can be used and acceptable examples could be a Support Vector Machine (SVM), a Naïve Bayes framework, and the like. A look-up-table (LUT) approach could also be used.

Another algorithm for determining the dominant transition location is shown in FIG. 9. In most instances, steps S801 and S803 will constitute step S511 in FIG. 7. The absolute value of the high-pass filtered version of the original signal data is calculated in step S801. The absolute value high-pass filter information is then used as a basis for filter mode selection in step S803.

A machine learning algorithm may be employed to learn the mapping from the step S801 to the filter modes of step S803. The high-pass filter information may be used as features to predict the optimal filter mode based on this information. Any machine learning algorithm can be used and acceptable examples could be a Support Vector Machine (SVM), a Naïve Bayes framework, and the like. A LUT approach could also be used.

Figure 10:
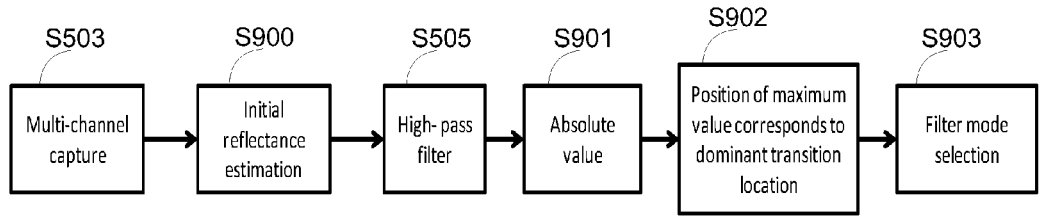
FIG. 10 illustrates a block diagram of data flow for estimation of dominant transition locations used to determine which filter mode to apply.

Yet another algorithm is disclosed in FIG. 10. In most instances, steps S901-S903 will constitute step S511, the determination of dominant transition locations as shown in FIG. 7. With reference to FIG. 10, as well as FIG. 7, the initial reflectance is estimated in step S900. In step S502, the default spectral sensitivities are used for the tunable sensors to capture a preview image. Next, the multi-channel read-outs are used to obtain an initial reflectance estimate via a pseudo-inverse technique, or some other acceptable spectral imaging technique. Spectral estimation consists of an inverse problem (i.e. a general framework that is used to convert observed measurements into information about a physical object or system that one is interested) amenable to solution via a pseudo-inverse method. Other acceptable spectral estimation methods that could be applied include eigenvector analysis with least squares, modified-discrete sine transformation, to name but a few. The pseudo-inverse technique will be discussed in subsequent paragraphs. An initial reflectance estimate is determined in step S900. This will be an estimate of the ratio of the total amount of radiation reflected by the object or scene to the total amount of radiation incident on the object or scene. In step S505, a high-pass filter is applied to the data collected during the initial reflectance estimate. As illustrated in FIG. 8, the absolute value of the data gathered in step S505 is determined. However, it is not necessary that the absolute value of the data be calculated to determine the dominant transition location. The position that results in the maximum absolute value of the high-pass filtered data corresponds to an estimate of the position of the dominant transition of the reflectance curve. The estimated position for the dominant transition is then used as a basis on filter selection. For example, if the dominant transition occurs in the red portion of the spectrum, a filter mode tailored to these types of reflectances could be used.

Figure 11:
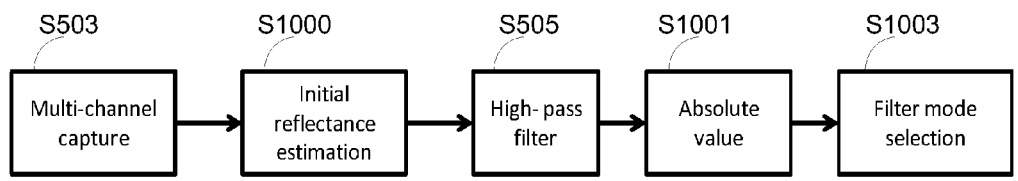
FIG. 11 illustrates a block diagram of data flow for estimation of dominant transition locations used to determine which filter mode to apply.

A modification to the algorithm discussed in connection with FIG. 10 is shown in FIG. 11. Similar to the algorithm of FIG. 10, an initial reflectance estimate is determined in step S1000. In most instances, steps S1001 and S1003 will constitute step S511, the determination of dominant transition locations as shown in FIG. 6. In step S505, a high-pass filter is applied to the data collected during the initial reflectance estimate. Next, the absolute value of the data gathered in step S505 is determined in step S1001. The position that results in the maximum absolute value of the high-pass filtered data corresponds to an estimate of the position of the dominant transition of the reflectance curve. The absolute value high-pass filter information is then used as a basis for filter mode selection in step S1003. The filter mode can be determined from absolute values of high-pass filter information using a LUT or a transformation that is calculated a priori using some machine learning technique such as SVM.

The filter modes successfully divide the scene into different regions, depending on a dominant transition location. The number of filter modes used is very important. In some case, using as little as two filter modes will most likely be sufficient for the tunable sensor spectral imaging system.

Returning to the description of FIG. 7, the new set of filters is determined in step S512. The new set of filters result from the filter mode selection process as described in connection with step S511 above.

In step S506, a spectral mask is constructed for application to the imaging sensor. The spectral mask is constructed by using the new set of filters determined in step S512. In particular, each filter is converted into a corresponding voltage adjustment to be applied to the pixel-by-pixel basis spatial electronic voltage mask.

In step S507, the voltage adjustments for each region are provided to the electronic mask generator for determination of a revised spatial mask.

In steps S508 and S502, the image controller sends a command to tune the imaging sensor in accordance with the revised spatial mask. As described above, in step S504, the scene property analysis module 3077 determines whether the captured spectral image is the final image, and if the scene property analysis module 3077 determines that the captured image is the final image ("YES" in step S504), then the captured spectral image is stored (step S509).

Thus, the present disclosure contemplates apparatus and methods for adaptive imaging to perform adjustments of spectral selectivity on a pixel-by-pixel basis for imaging sensors with tunable spectral properties. As seen herein, there are in combination an imaging sensor with tunable spectral responsivities, an imaging controller that controls the imaging sensor and also a spatial pixel-by-pixel basis electronic mask generation unit that generates pixel-based spatial electronic masks to control the shape of the sensitivity curves of the imaging sensor with tunable spectral responsivities, a scene property analysis module that analyzes the properties of scene based on images captured by the imaging sensor with tunable spectral responsivities using electronic control signals generated by the electronic mask generation unit, and a module generates a revised spatial mask from the results of the scene analysis or to render the final image. One such imaging sensor may be a transverse field detector (TFD) sensor, and the imaging sensor may capture multiple images.

Also contemplated herein are iterative methods and apparatus for spatial non-uniformity correction based on an imaging sensor with tunable spectral responsivities, comprising an imaging sensor with tunable spectral responsivities, an initial state for the pixel-based spatial electronic mask, an imaging control that captures an image with initial state pixel-based spatial electronic mask, a scene analysis module that analysis spatial uniformity of captured image, and a decision module that decides if the spatial uniformity is within pre-established tolerances or not. If the criteria of spatial uniformity are met the final pixel-based electronic spatial mask is saved in a memory unit. If the criteria are not met the method goes to the next iteration by generating appropriate spatial compensation for the spatial non-uniformity in light sensitivity and color and appropriate pixel-basis spatial electronic masks are generated for the subsequent image capture.

In the embodiments described thus far, the filter modes are preset curves for the spectral sensitivities of the tunable sensors. One objective as disclosed herein is to assign a filter mode to regions that are more suited for that specific filter mode. For example, a red region of a scene will likely have a large drop-off near one side of the electromagnetic spectrum. Thus, it would be desirable to use a filter mode that has more spectral sensitivity near this drop-off, for the red regions. The discrete derivative of the channel readouts for every pixel may be used as a feature for a multi-class support vector machine (SVM), which will then determine which filter mode to use for every pixel of the image.

As described thus far, every filter mode will likely require a different transformation matrix A, which will produce the M channel multi-spectral output matrix, given an N channel readout matrix, where M>N. The pseudo inverse method is one method to recover estimated reflectance from the sensor readouts. The mathematical equation for this method is stated as follows:

$$A = R \cdot pinv(D)$$

Where R (with dimensions k by M) is a matrix of ground-truth reflectances, and D is an N by k dimension matrix of channel readout values. Pinv denotes the pseudo-inverse operation. The quality of the transformation matrix A depends on the amount of the data used in the training.

To optimally calculate transformation matrix A during a training phase, regions of the captured image which are expected to be assigned to the specific filter mode should be used. Filter mode assignment may then be performed by predicting what regions may work best for a particular filter mode. These regions can be discovered during the training period since reflectance information from the scene has been obtained (i.e. See S900) and therefore an error metric, such as spectral rms error, can be determined.

Regions expected to correspond to the current filter mode should be used because it is desired for these filter mode" matrices to be as specific to the collected data as possible. Using a specific matrix to the data will improve the results for the regions that are assigned to that filter mode. If filter mode selection is performed well, then during testing, the matrix A will only operate on channel readouts that are similar to that of the training data. Channel readouts similar to those of regions not assigned to the specific filter mode are not expected to be assigned to said filter mode during evaluation. Training on data that is not specific would not produce optimal result, since a pseudo-inverse approach (which tries to minimize the least squares error in the training data) is used to calculate A. Without using a specific training data to corresponding filter modes affects the performance of tunable sensors.

Figure 12:
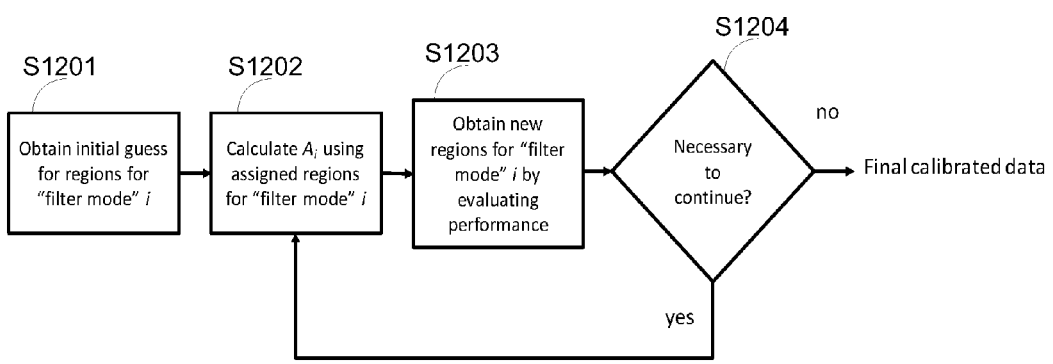
FIG. 12 is a block diagram of an iterative algorithm proposed for the solution of a pseudo-inverse problem disclosed herein.

An iterative algorithm is proposed for the training phase as shown in FIG. 12 to overcome this issue and make it automated. Suppose that there are n filter modes. $A_i$ will then correspond to the transformation matrix for filter mode i, the subscript "i" refers to a different one of the filter modes in the pre-designated collection of filter modes.

For each filter mode, calculate an initial guess of the regions in which A, works best, as shown in step S1201. Any initial guess technique may be used. An example method would include analyzing the first derivative of the channel readouts from the sensor, and finding the position corresponding to the maximum first derivative. Then, depending on this maximum position, assign initial guesses for which filter mode to use.

In step S1202, for each filter mode, obtain transformation matrix A, using the pseudo-inverse method as described above, or alternative spectral-imaging method. Typically, only the image regions assigned to filter mode i when calculating $A_i$.

Next, in step S1203, the training reflectance is used as reference to evaluate which filter mode is optimal for every pixel of the image. This information is assigned as updated initial estimations for filter mode image regions.

If it is determined that it is necessary to continue (i.e. "yes" in step S1204), repeat from step S1202, until desired, or convergence of error and filter mode regions. An error metric such as rms spectral error could be used as a convergence error with a pre-established threshold value error. If the calculated errors is smaller than the threshold value for the error the iterative process stops and the resulting final calibrated data is the correspondence between calculated spectral feature (such as absolute value of the derivatives) and filter mode.

Figure 13:
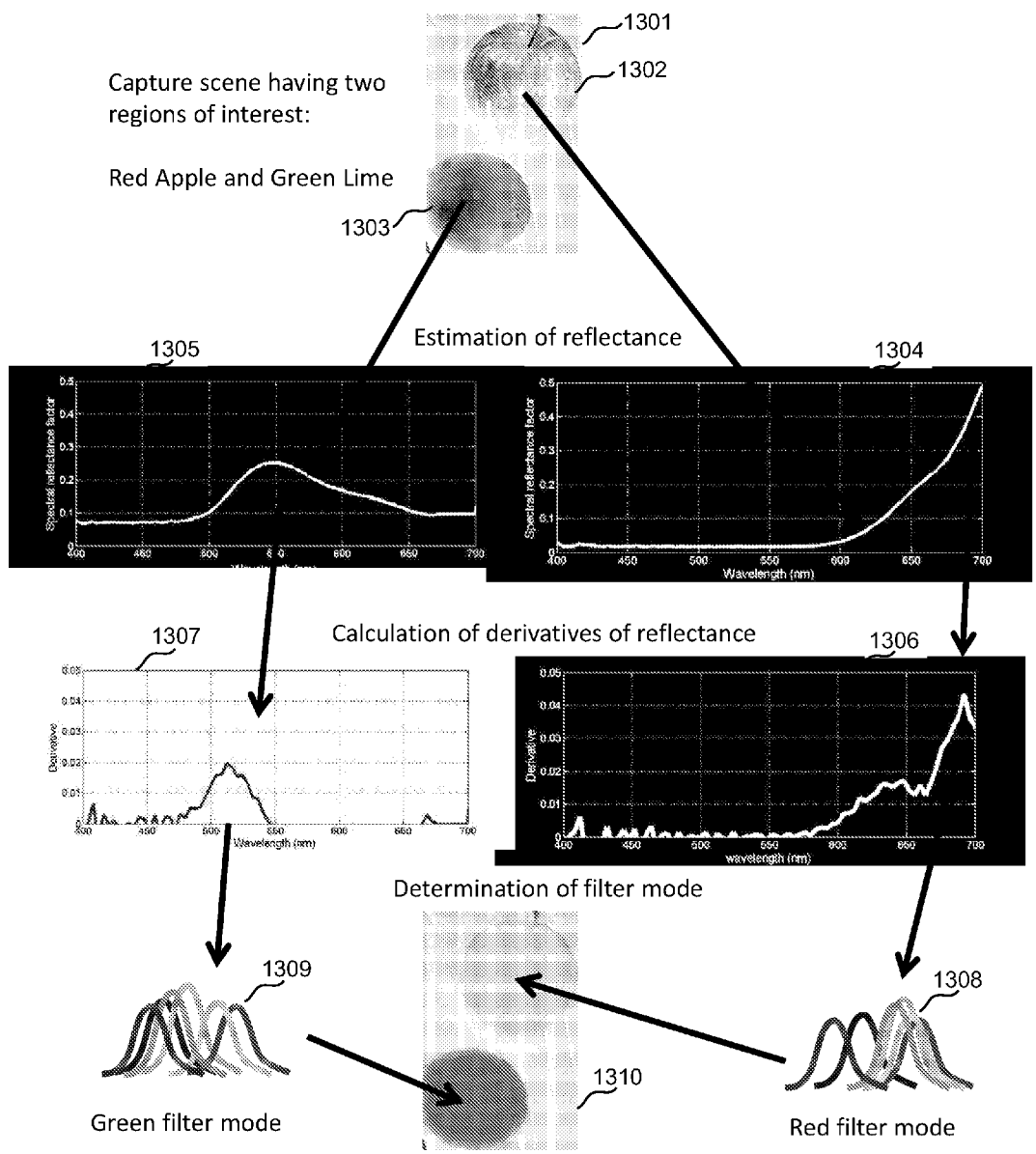
FIG. 13 provides a pictorial representation of an estimation of dominant transition locations used to determine which filter mode to apply.

FIG. 13 provides an exemplary pictorial representation of how one might implement one of the methods to anticipate an optimal filter mode to be applied to a captured scene, as described herein. A sample image of the scene 1301, which includes a red apple 1302 and a green lime 1303, is initially captured with data being collected from the channel read-outs from the different sensor channels. A default filter mode may be applied for the initial capture. With the data collected from the channel read outs, an estimation of the reflectance of the scene may be determined. A typical estimated reflectance for the red apple 1304 and a typical estimated reflectance for the green lime 1305 are illustrated as functions of wavelength. The slope of the curves illustrated in 1304 and 1305 increase in the region of the visible spectrum near the colors of the objects, or regions, of interest in the scene. For example, curve 1305 increases in a range from about 500 nanometers (nm) to 550 nm and decreases in a range from about 550 nm to 600 nm. The region spanning 500 nm to 600 nm includes the color "green" and the object of interest is a green lime. By calculating the first derivative 1306, 1307 of the reflectance curves 1304, 1305, respectively, it is seen that the largest change in the first derivative occurs where the reflectance curves spike, or increase. The locations where the greatest change in first derivative occurs can be used to determine the dominant regions of transition for the scene. These regions in the first derivative 1306, 1307 can also be used to select an appropriate filter mode, as shown in 1308 and 1309. A green filter mode 1309 is then selected for the green lime, based on the calculation of the first derivative of the reflectance curve 1305 and, likewise, a red filter mode 1308 is then selected for the red apple, based on the calculation of the first derivative of the reflectance curve 1306. The appropriate filter modes 1308, 1309 are then applied to the initial capture scene and the scene can be re-evaluated with the appropriate filter mode being used, as seen in 1310.

Simulation

A virtual model of the tunable imaging assembly was developed to simulate the tunable sensors as well as verify the ideas and concepts disclosed herein. Theoretical tunable sensors, with different modes of operation, were used in this particular simulation. The filters were allowed to change, or switch between filter modes, depending on an initial evaluation of the scene. Seven filter modes were used for this simulation with each filter mode directed toward a different portion of the visible color spectrum. The seven filter modes selected for use in the simulation were specialized for the following colors: red, green, blue, yellow, "long-red", and "short-blue". Moreover, a default filter mode was also used in the simulation. The default filter mode is the filter mode that samples the visible spectrum in a relatively even way. A 1-vs-all SVM, for filter mode selection, was performed using LIBLINEAR (i.e. a library for large linear classification), Version 1.8, and applying default settings.

All simulations for the test cases disclosed herein were performed using the Image Systems Evaluation Tools (ISET) Toolbox. This ISET toolbox works in conjunction with the commercially available software package Matlab®, to simulate a complete camera system. White photon noise was included in the simulation to emulate a real-world scenario. Other real-world factors, such as sensor pixel saturation and quantization noise, were also modeled by ISET. Complete scenes with known reflectances were used as an input for the ISET simulation system, which then simulated a lens and sensor for specific camera systems. Spectral sensitivities for the sensor were modified to perform multispectral imaging simulation.

The sample scenes evaluated in the simulation included sixteen different multispectral scenes having known reflectances. A range of ground truth data ranging from 400 to 680 nm in intervals of 10 nm was provided. These multispectral scenes were obtained via different sources. For example, twelve of scenes were from the ISET simulation toolbox (i.e. a component of the software), while six of the scenes were obtained from other sources. Eight random scenes were used to train the linear transformation matrix, and tested the performance of our system on the remaining eight scenes. To allow for even sampling of training and testing scenes, the scenes were originally split into three sub-databases, scenes with people, scenes with fruits/vegetables, and scenes of foliage. Three sample representations of the scenes used for the simulation can be found in a publication by A. Lin, F. H. Imai, Efficient spectral imaging based on imaging systems with scene adaptaion using tuanble color pixels, *Proc. of 19th IS&T/SID Color and Imaging Conference*, 2011, pp. 332-338. These three sub-databases were then sampled separately in order to obtain the training and testing scenes for the experiment.

The first system studied was the ISET simulation of a system with a sensor based from the conventional spectral sensitivities of a multispectral camera. The pseudo-inverse procedure as disclosed herein was used to recover spectral reflectances from the six input channels. In a conventional system, the same filters are applied globally to an entire image. In other words, six separate captures are assumed, with no demosaicing required.

The second system studied was a conventional spectral imaging system. The sensor was simulated with a 6-channel multispectral filter array, and demosaiced with a generic 6-channel demosaicing algorithm. The filters used are identical to the ones used in the first system. In contrast to the first system, the second system only requires one capture, but sacrifices some spatial resolution in exchange. For example, a 50-megapixel multispectral camera may use a mosaiced multiband acquisition system with 6-channels.

The third system studied was the tunable sensor multispectral capture system disclosed herein. As described earlier, this system uses multiple filter modes. The system adaptively chooses between these modes depending on an initial estimation of the spectrum for each pixel in the scene using a linear SVM.

The root-mean-square (RMS) spectral error between the conventional and tunable sensor methods and the ground truth reflectances was calculated. The RMS conveys the correlation between original and estimated spectral curves.

The methods disclosed herein were also evaluated on Euclidean distance in S-CIELAB space, averaged among fifteen standard illuminants. In other words, fifteen standard illuminants were used for error evaluation and calculated the S-CIELAB (2 degree observer) space distance when the ground truth reflectance and the estimated reflectance were illuminated with selected illuminants. The S-CIELAB distance generally provides a metric that is closer to human perceived error when viewing images, than a more conventional metric such as CIEDE2000.

A mean metamerism index (MI) was also calculated using the parameric correction using CIEDE2000. The MI was measured between the ground truth reflectance, and the estimated reflectance for all combinations of the fifteen different illuminants. These measurements were then averaged for a final metric. The MI conveys the robustness of the spectral estimation to changes in illumination compared to the original spectra.

Figure 14:
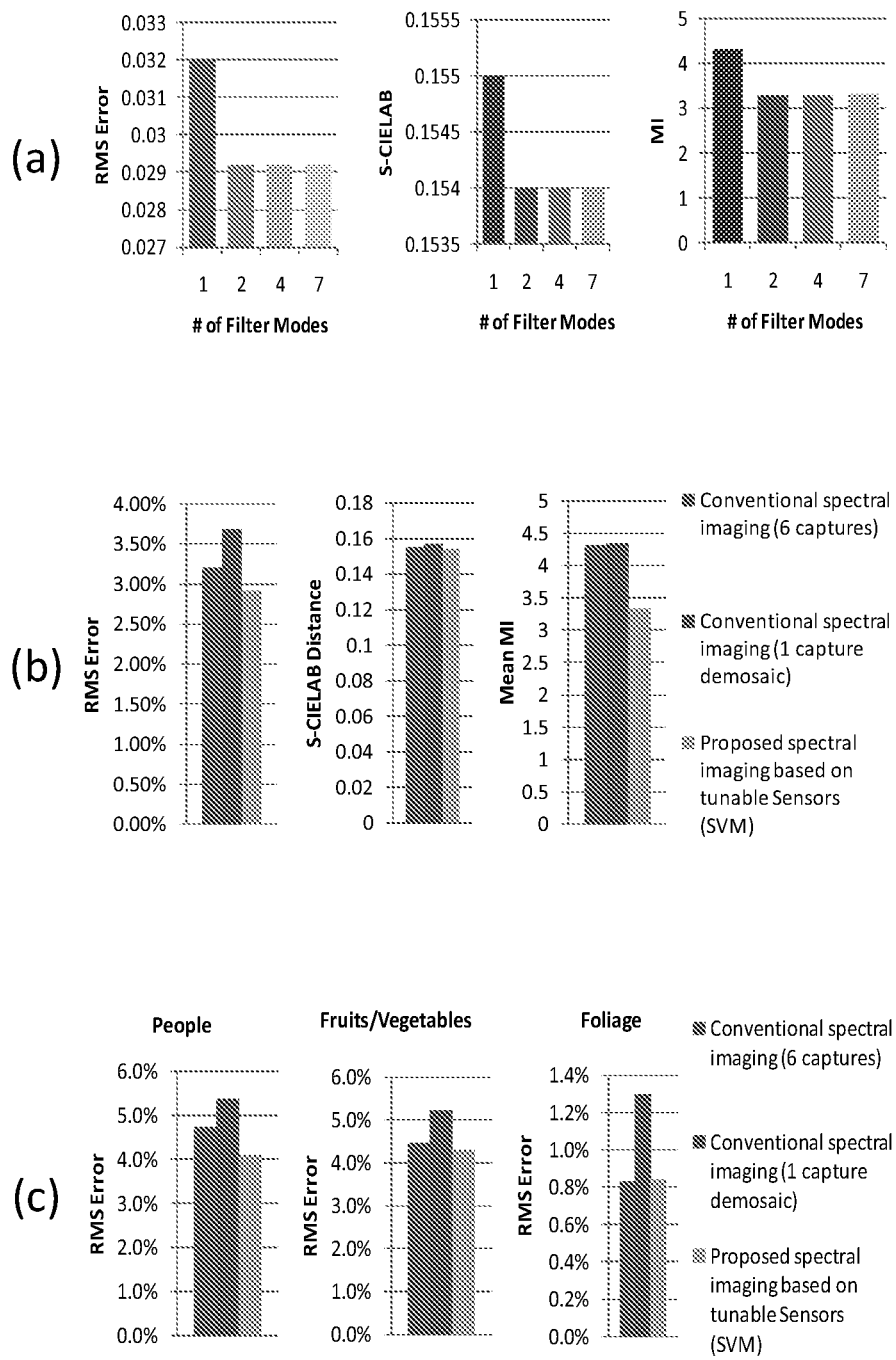
FIGS. 14 (a)-(c) show the influence of number of filter modes on performance, comparison of new method compared to conventional methods; average RMS error, S-CIELAB distance, and MI for the entire test; and average RMS error divided into test set categories, respectively.

FIG. 14(a) depicts the influence the number of filter modes has on performance. FIG. 14 (b) illustrates the average RMS error, S-CIELAB distance, and MI for the entire test set. FIG. 14 (c) depicts the average RMS error divided into test set categories. For the simulation performed and described herein, the "People" category shows the most improvement versus the conventional six capture imaging while the "Foliage" category shows the best performance overall. Thus, an aspect of this disclosure is an improvement in performance using tunable sensors when compared to performance obtained using traditional sensors for multispectral imaging (See FIGS. 14 (b) and (c)). There is also an improvement in efficiency since instead of capturing 6 channels as in the conventional method without demosaicing, in this approach there is one single capture after analysis of the preview image.

Calibration was performed separately for each filter mode. For simplicity, the entire training set was used to produce a calibration matrix via the pseudo-inverse method previously discussed. The filter modes successfully divide the scene into different regions, depending on dominant transition location. The number of filter modes used may affect the result. As shown in FIG. 14 (a), using as little as 2 filter modes may be sufficient for the tunable sensor spectral imaging system. For the particular simulation discussed in this document, filter modes were hand-picked and many of the filter modes may be non-optimal.

Since tunable sensors potentially can adapt to the spectral band with more content they can more efficiently distribute the sensitivity curves to account for the data, and therefore produce more accurate estimated reflectances. These results at least indicate that tunable sensors improve the performance for multispectral cameras by tuning sensor sensitivities to adapt to the content of the scene prior to image capture.

Other examples may be developed in accordance with the description herein for use of an imaging assembly which has a spectral response which is tunable in accordance with a capture parameter, such as an imaging assembly with an image sensor which has a tunable spectral response or an imaging assembly with an image sensor and a preceding color filter array which has a tunable spectral response.

In the embodiments described herein, the tunable imaging assembly may be tunable such that each pixel or each region of multiple pixels is tunable individually, such that the spectral responsivity of each pixel or region of pixels is tunable independently of the spectral responsivity of other pixels or regions of pixels. In some example embodiments, the entirety of the imaging assembly may be tuned to the same spectral responsivity, such that substantially all pixels and substantially all regions of pixels are tuned to substantially the same spectral responsivity.

According to other embodiments contemplated by the present disclosure, example embodiments may include a computer processor such as a single core or multi-core central processing unit (CPU) or micro-processing unit (MPU), which is constructed to realize the functionality described above. The computer processor might be incorporated in a stand-alone apparatus or in a multi-component apparatus, or might comprise multiple computer processors which are constructed to work together to realize such functionality. The computer processor or processors execute a computer-executable program (sometimes referred to as computer-executable instructions or computer-executable code) to perform some or all of the above-described functions. The computer-executable program may be pre-stored in the computer processor(s), or the computer processor(s) may be functionally connected for access to a non-transitory computer-readable storage medium on which the computer-executable program or program steps are stored. For these purposes, access to the non-transitory computer-readable storage medium may be a local access such as by access via a local memory bus structure, or may be a remote access such as by access via a wired or wireless network or Internet. The computer processor(s) may thereafter be operated to execute the computer-executable program or program steps to perform functions of the above-described embodiments.

According to still further embodiments contemplated by the present disclosure, example embodiments may include methods in which the functionality described above is performed by a computer processor such as a single core or multi-core central processing unit (CPU) or micro-processing unit (MPU). As explained above, the computer processor might be incorporated in a stand-alone apparatus or in a multi-component apparatus, or might comprise multiple computer processors which work together to perform such functionality. The computer processor or processors execute a computer-executable program (sometimes referred to as computer-executable instructions or computer-executable code) to perform some or all of the above-described functions. The computer-executable program may be pre-stored in the computer processor(s), or the computer processor(s) may be functionally connected for access to a non-transitory computer-readable storage medium on which the computer-executable program or program steps are stored. Access to the non-transitory computer-readable storage medium may form part of the method of the embodiment. For these purposes, access to the non-transitory computer-readable storage medium may be a local access such as by access via a local memory bus structure, or may be a remote access such as by access via a wired or wireless network or Internet. The computer processor(s) is/are thereafter operated to execute the computer-executable program or program steps to perform functions of the above-described embodiments.

The non-transitory computer-readable storage medium on which a computer-executable program or program steps are stored may be any of a wide variety of tangible storage devices which are constructed to retrievably store data, including, for example, any of a flexible disk (floppy disk), a hard disk, an optical disk, a magneto-optical disk, a compact disc (CD), a digital versatile disc (DVD), micro-drive, a read only memory (ROM), random access memory (RAM), erasable programmable read only memory (EPROM), electrically erasable programmable read only memory (EEPROM), dynamic random access memory (DRAM), video RAM (VRAM), a magnetic tape or card, optical card, nanosystem, molecular memory integrated circuit, redundant array of independent disks (RAID), a nonvolatile memory card, a flash memory device, a storage of distributed computing systems and the like. The storage medium may be a function expansion unit removably inserted in and/or remotely accessed by the apparatus or system for use with the computer processor(s).

This disclosure has provided a detailed description with respect to particular representative embodiments. It is understood that the scope of the appended claims is not limited to the above-described embodiments and that various changes and modifications may be made without departing from the scope of the claims.

The present application is the non-provisional application of U.S. Provisional Patent Application No. 61/532,969, filed on Sep. 9, 2011, the content of which is expressly incorporated by reference herein in its entirety.

What is claimed:

1. A method for adaptive spectral image capture using an image capture device which includes an imaging assembly having a spectral response which is tunable in accordance with a capture parameter, the method comprising:
   applying a default capture parameter to the imaging assembly, wherein the default capture parameter has high spectral dimensionality;
   capturing a sample image of a scene;
   analyzing the sample image to identify transition zones between multiple different regions in the scene, wherein each of such multiple different regions shares similar spectral content that is dissimilar from spectral content in adjacent ones of the multiple different regions;
   adjusting a spectral sensitivity of the imaging assembly for each region of the multiple different regions by determining a capture parameter to be applied to the imaging assembly;
   applying the capture parameter to the imaging assembly; and
   capturing and storing a spectral image of the scene,
   wherein identification of each transition zone comprises:
   applying a high-pass filter to the sample image to derive a preliminary estimate of the transition zone;
   selecting a filter mode from among a predetermined collection of filter modes, wherein the selected filter mode is selected based on color characteristics of the preliminary estimate of the transition zone; and
   applying the selected filter mode to the sample image.

2. A method for adjusting spectral image capture according to claim 1, wherein adjusting the spectral sensitivity of the imaging assembly includes shifting a peak wavelength of at least one sensitivity curve.

3. A method for adjusting spectral image capture according to claim 1, wherein adjusting the spectral sensitivity of the imaging assembly includes changing a width at half of a peak magnitude of at least one sensitivity curve.

4. A method for adjusting spectral image capture according to claim 1, wherein adjusting the spectral sensitivity of the imaging assembly includes changing an amplitude of at least one spectral sensitivity curve.

5. A method for adjusting spectral image capture according to claim 1, wherein adjusting the spectral sensitivity of the imaging assembly includes changing a shape eccentricity of at least one spectral sensitivity curve.

6. The method according to claim 1, wherein the predetermined collection of filter modes includes at least a first filter mode for detection of red transition zones, a second filter mode for detection of blue transition zones, and a third filter mode for detection of green transition zones.

7. The method according to claim 1, wherein each filter mode is comprised of a preset curve for the spectral response of the tunable imaging assembly.

8. The method according to claim 1, wherein each filter mode is at least partially implemented via a different matrix A that produces an M-channel multi-spectral output for a given N-channel readout (M>N).

9. The method according to claim 1, wherein the filter mode is determined by a machine learning algorithm.

10. The method according to claim 9, wherein the machine learning algorithm is support vector machine.

11. The method according to claim 1, wherein numerical values for each filter mode are calculated during a training period.

12. The method according to claim 11, wherein the training period is iterated and comprises:
   obtaining an initial guess as to which spectral regions a filter mode might work best on based on dominant transition region spectrum;
   a first iterated step in which numerical values for the filter mode are calculated from an estimate of spectral region in a prior iteration;
   a second iterated step in which each such filter mode is evaluated for effectiveness against other filter modes by comparing the ground truth with estimated spectral reflectance using the numerical values obtained in the previous step for the entire training set;
   the regions in which a specific filter mode works best becomes associated with the filer mode; and
   these regions become the guess for the next iteration;
   repeat application of the previous steps until convergence of error towards the filter mode region meets a stopping condition.

13. The method according to claim 12, wherein obtaining the initial guess comprises:
   analyzing a derivative of channel readouts from the sample image;
   determining a position corresponding to the maximum of the derivative; and
   assigning an initial guesses for which filter mode to use depending on the position of the maximum.

14. The method according to claim 12, wherein in the first iterated step, numerical values for the filter mode are calculated using a pseudo-inverse.

15. The method according to claim 12, wherein in the first iterated step, numerical values for the filter mode are calculated using a spectral-imaging method.

16. The method according to claim 11,
   wherein the selected filter mode is selected from among a predetermined collection of filter modes, wherein each filter mode is at least partially implemented via a different matrix Ai that produces an M-channel multi-spectral output for a given N-channel readout (M>N), and wherein the subscript "i" refers to a different one of the selected filter modes in the pre-designated collection of filter modes.

* * * * *